(12) United States Patent
Chu (10) Patent No.: US 11,798,617 B2
(45) Date of Patent: Oct. 24, 2023

(54) METHOD AND APPARATUS FOR DETERMINING SENSE BOUNDARY OF SENSE AMPLIFIER, MEDIUM, AND DEVICE

(71) Applicant: CHANGXIN MEMORY TECHNOLOGIES, INC., Hefei (CN)

(72) Inventor: Xikun Chu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/807,760

(22) Filed: Jun. 20, 2022

(65) Prior Publication Data
US 2023/0307035 A1    Sep. 28, 2023

Related U.S. Application Data

(63) Continuation of application No. PCT/CN2022/096257, filed on May 31, 2022.

(30) Foreign Application Priority Data

Mar. 23, 2022   (CN) .......................... 202210295229.7

(51) Int. Cl.
| | |
|---|---|
| *G11C 7/12* | (2006.01) |
| *G11C 11/4091* | (2006.01) |
| *G11C 11/4096* | (2006.01) |
| *G11C 29/12* | (2006.01) |
| *G11C 29/04* | (2006.01) |

(52) U.S. Cl.
CPC ...... *G11C 11/4091* (2013.01); *G11C 11/4096* (2013.01); *G11C 29/12005* (2013.01); *G11C 7/12* (2013.01); *G11C 29/04* (2013.01)

(58) Field of Classification Search
CPC ......................... G11C 11/4091; G11C 11/4096
See application file for complete search history.

(56) References Cited

U.S. PATENT DOCUMENTS

| | | | |
|---|---|---|---|
| 6,023,434 | A | 2/2000 | Shore et al. |
| 6,041,002 | A | 3/2000 | Maejima |
| 6,636,998 | B1 | 10/2003 | Lee et al. |

(Continued)

FOREIGN PATENT DOCUMENTS

| | | | |
|---|---|---|---|
| CN | 101136253 A | | 3/2008 |
| CN | 101162606 A | | 4/2008 |

(Continued)

OTHER PUBLICATIONS

China International Search Report and written opinion in Application No. PCT/CN2022/096257, dated Dec. 19, 2022.
(Continued)

*Primary Examiner* — Mushfique Siddique
(74) *Attorney, Agent, or Firm* — SYNCODA LLC; Feng Ma (57) ABSTRACT

A method for determining a sense boundary of a sense amplifier includes: writing first data into a memory array; reading the first data in a first memory cell of the memory array, and reversely writing second data into the first memory cell; reading, after a preset row precharge time, the first data in a second memory cell on a bit line where the first memory cell is located; and reversely writing the second data into the second memory cell when the first data is read in the second memory cell.

16 Claims, 9 Drawing Sheets

(56) References Cited

U.S. PATENT DOCUMENTS

| | | | |
|---|---|---|---|
| 7,478,294 | B2 | 1/2009 | Rong et al. |
| 7,633,818 | B2 | 12/2009 | Tomita |
| 8,397,129 | B2 | 3/2013 | Schreck et al. |
| 9,281,075 | B2 | 3/2016 | Ryu et al. |
| 10,854,275 | B2 | 12/2020 | Son |
| 2002/0051401 | A1 | 5/2002 | Lee |
| 2002/0080677 | A1* | 6/2002 | Watanabe ............ G11C 11/4085 365/201 |
| 2006/0083070 | A1 | 4/2006 | Arakawa |
| 2006/0133166 | A1* | 6/2006 | Kikutake ............ G06F 11/1032 365/201 |
| 2007/0159900 | A1* | 7/2007 | Aoki ..................... G11C 29/02 365/201 |
| 2008/0019199 | A1 | 1/2008 | Uchikoba et al. |
| 2010/0302866 | A1 | 12/2010 | Cha et al. |
| 2011/0121294 | A1 | 5/2011 | Koyama et al. |
| 2012/0151299 | A1* | 6/2012 | Suh ................... G11C 11/40615 714/E11.002 |
| 2013/0215698 | A1* | 8/2013 | Nagata ..................... G11C 7/08 365/203 |
| 2019/0066770 | A1 | 2/2019 | Sisodia et al. |
| 2020/0176053 | A1 | 6/2020 | Lin et al. |
| 2020/0388309 | A1 | 12/2020 | Gupta et al. |
| 2022/0076730 | A1* | 3/2022 | Ning ................... G11C 11/4076 |
| 2022/0236905 | A1* | 7/2022 | Wagner ................ G11C 29/028 |
| 2022/0308788 | A1* | 9/2022 | Zhao ................ G11C 29/12005 |
| 2022/0319577 | A1* | 10/2022 | Chen ................... G11C 11/4096 |
| 2023/0008272 | A1 | 1/2023 | Rana et al. |

FOREIGN PATENT DOCUMENTS

| | | | | |
|---|---|---|---|---|
| CN | 107039084 | B | | 4/2020 |
| CN | 112053713 | A | | 12/2020 |
| CN | 112099734 | A | | 12/2020 |
| CN | 112216339 | A | | 1/2021 |
| CN | 112885401 | A | * | 6/2021 ......... G11C 11/4091 |
| CN | 113035259 | A | | 6/2021 |
| CN | 114187956 | A | | 3/2022 |

OTHER PUBLICATIONS

China International Search Report and written opinion in Application No. PCT/CN2022/096275, dated Dec. 5, 2022.
International Search Report and written opinion in Application No. PCT/CN2022/089105, dated Dec. 16, 2022.
U.S. office action in U.S. Appl. No. 17/846,009, dated Apr. 18, 2023.
U.S. office action in U.S. Appl. No. 17/846,009, dated Jul. 31, 2023.
U.S. office action in U.S. Appl. No. 17/846,009, dated Aug. 28, 2023.

* cited by examiner

METHOD AND APPARATUS FOR DETERMINING SENSE BOUNDARY OF SENSE AMPLIFIER, MEDIUM, AND DEVICE

CROSS-REFERENCE TO RELATED APPLICATIONS

This is a continuation of International Application No. PCT/CN2022/096257 filed on May 31, 2022, which claims priority to Chinese Patent Application No. 202210295229.7 filed on Mar. 23, 2022. The disclosures of these applications are hereby incorporated by reference in their entirety.

BACKGROUND

Dynamic random access memory (DRAM) is a commonly-used semiconductor memory device in computers. Due to such advantages as simple structure, high density, low power consumption, and low price, the DRAM has been widely used in the computer field and electronic industry.

For the DRAM, in the reading and writing stage, it is often necessary to amplify tiny voltage change on a bit line through a sense amplifier and convert the same into a digital signal to facilitate the reading of data.

However, some sense amplifiers are prone to generating sense errors at a sense boundary, resulting in errors in read data. Therefore, determining the sense boundary of the sense amplifier is of great significance for evaluating the amplification performance of the sense amplifier.

SUMMARY

The present disclosure relates to, but is not limited to, a method for determining a sense boundary of a sense amplifier, an apparatus for determining a sense boundary of a sense amplifier, a computer-readable storage medium, and an electronic device.

An overview of the subject matter detailed in the present disclosure is provided below, which is not intended to limit the protection scope of the claims.

An objective of the present disclosure is to provide a method for determining a sense boundary of a sense amplifier, an apparatus for determining a sense boundary of a sense amplifier, a computer-readable storage medium, and an electronic device.

According to a first aspect of the present disclosure, a method for determining a sense boundary of a sense amplifier is provided. The method includes: writing first data into a memory array; reading the first data in a first memory cell of the memory array, and reversely writing second data into the first memory cell; reading, after a preset row precharge time, the first data in a second memory cell on a bit line where the first memory cell is located; and reversely writing the second data into the second memory cell when the first data is read in the second memory cell, changing the preset row precharge time until the sense amplifier cannot correctly read the first data on the bit line, and determining a corresponding critical row precharge time as a row precharge time boundary value.

According to a second aspect of the present disclosure, an apparatus for determining a sense boundary of a sense amplifier is provided. The apparatus includes: one or more processors; and a storage apparatus, configured to store one or more programs, wherein the one or more programs, when executed by the one or more processors, cause the one or more processors to execute operations of: writing first data into a memory array; reading the first data in a first memory cell of the memory array, and reversely writing second data into the first memory cell; reading, after a preset row precharge time, the first data in a second memory cell on a bit line where the first memory cell is located; and reversely writing the second data into the second memory cell when the first data is read in the second memory cell, changing the preset row precharge time until the sense amplifier cannot correctly read the first data on the bit line, and determining a corresponding critical row precharge time as a row precharge time boundary value.

According to a third aspect of the present disclosure, a computer-readable storage medium is provided, on which a computer program is stored, where the computer program is executed by a processor to implement the method for determining a sense boundary of a sense amplifier according to the first aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A semiconductor memory is used in computers, servers, handheld devices such as mobile phones, printers, and many other electronic devices and applications. The semiconductor memory includes a plurality of memory cells in a memory array, and each memory cell stores at least one bit of information. A dynamic random access memory (DRAM) is an example of such a semiconductor memory. This solution is preferably used in the DRAM. Therefore, the descriptions of embodiments below are made with reference to the DRAM as a non-limiting example.

In a DRAM integrated circuit device, memory cells in an array are typically arranged in rows and columns, such that a particular memory cell may be addressed by specifying a row and a column of its array. A word line connects the rows to a group of bit line sense amplifiers (SAs) that detect data in the cells. A data subset in the SAs is then selected or "column-selected" for output in a read operation.

Figure 1:
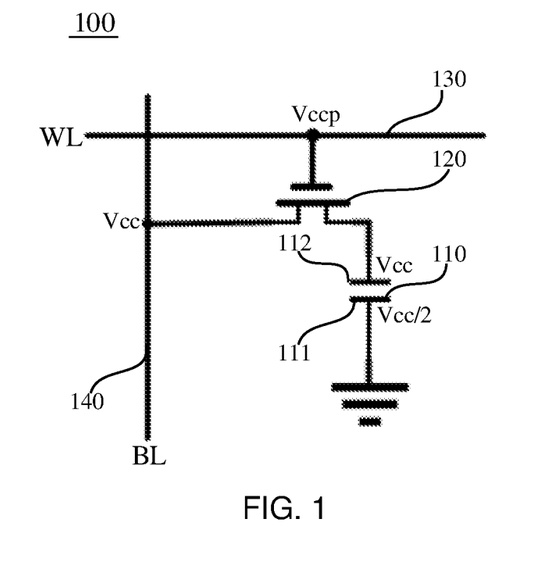
FIG. 1 schematically illustrates a schematic structural diagram of a memory cell according to an exemplary embodiment of the present disclosure.

Referring to FIG. 1, each memory cell 100 in the DRAM typically includes a capacitor 110, a transistor, 120, a word line (WL) 130, and a bit line (BL) 140. The transistor 120 is provided with a gate connected to the word line 130, a drain connected to the bit line 140, and a source connected to the capacitor 110. A voltage signal on the word line 130 can control the transistor 120 to be turned on or off, and then data information stored in the capacitor 110 is read through the bit line 140, or data information is written into the capacitor 110 through the bit line 140 for storage. The memory array includes the above multiple memory cells.

The memory array generally occupies 50-65% of the area of the entire DRAM device, and the rest area of the DRAM device is mainly occupied by a peripheral circuit.

Figure 2:
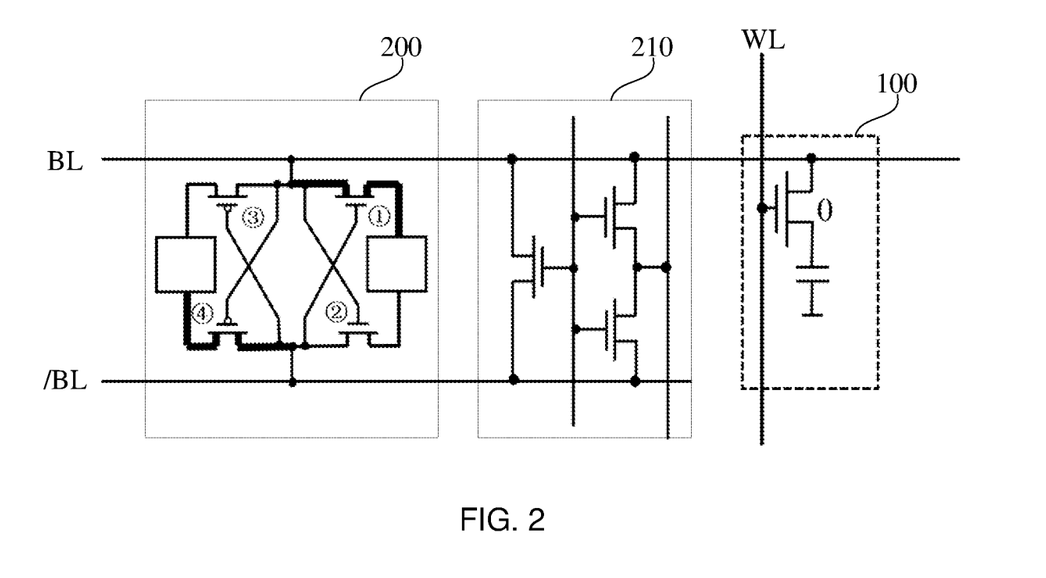
FIG. 2 schematically illustrates a schematic structural diagram of a connection relationship between a sense amplifier and a memory cell according to an exemplary embodiment of the present disclosure.

In the process of reading the data stored in the memory cell 100, it is necessary to amplify tiny voltage change on the bit line through the sense amplifier and convert same into a digital signal. Referring to FIG. 2, which illustrates a schematic structural diagram of a connection relationship between a sense amplifier and a memory cell. A bit line BL, a complementary bit line /BL, a word line WL, a sense amplifier 200, and a memory cell 100 are included. The memory cell 100 is provided with a gate connected to the word line WL and a drain connected to the bit line BL. The sense amplifier 200 operates with the bit line BL and the complementary bit line /BL serving as a reference line to detect and amplify a voltage difference on a pair of bit lines BL and /BL.

In the exemplary implementation of the present disclosure, a bit line equilibrium module 210 is also provided between the bit lines BL and the complementary bit line /BL, where the bit line balance module 210 is configured to pinch the bit line BL and the complementary bit line /BL under the action of a bit line equilibrium control signal BLEQ, so as to turn off the read and write operations to the memory cell 100.

Figure 3:
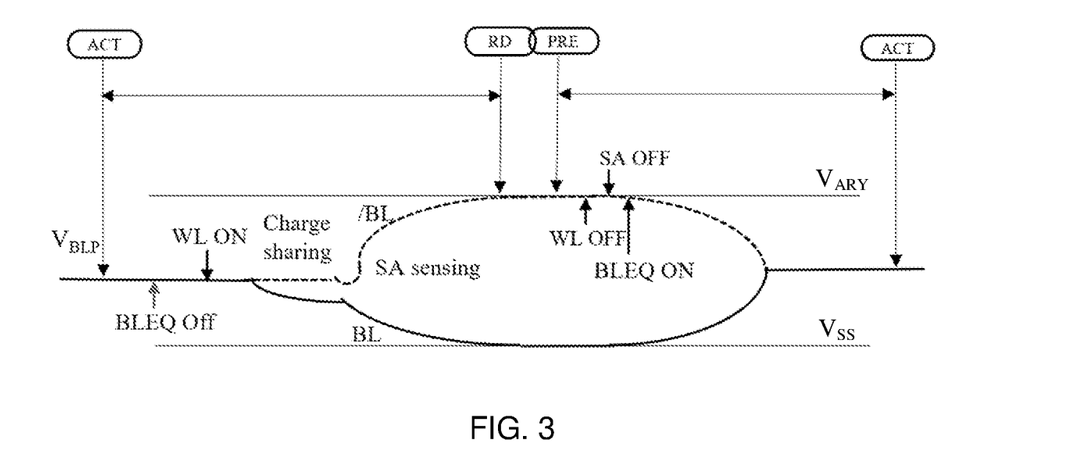
FIG. 3 schematically illustrates a schematic diagram of a potential change when a sense amplifier normally reading data 0 according to an exemplary embodiment of the present disclosure.

The process of amplifying the data stored in the memory cell 100, such as data 0, by the sense amplifier 200 will be described in detail below. Referring to FIG. 3, upon the reception of an activation signal ACT, a VBLP voltage is provided, such that the bit line equilibrium control signal BLEQ is turned off (i.e., BLEQ Off), and the pinched bit line BL and the complementary bit line /BL are separated. Then, the word line WL is turned on (i.e., WL ON), the transistor connected to the word line WL is turned on, and the voltage on the capacitor connected to the transistor is released onto the bit line BL through charge sharing, and the capacitor may store data 1 or data 0.

By taking the data 0 stored in the capacitor as an example, the stored 0 is shared from the bit line BL to the capacitor terminal, resulting in a negative voltage difference $\Delta V$, such that the voltage on the bit line BL becomes VBLP-$\Delta V$. At this time, the voltage on the complementary bit line /BL is still VBLP.

In FIG. 2, the sense amplifier 200 includes a first transistor (1), a second transistor (2), a third transistor (3), and a fourth transistor (4), where both the first transistor (1) and the second transistor (2) are negative channel metal oxide semiconductor (NMOS) transistors, and both the third transistor (3) and the fourth transistor (4) are positive channel metal oxide semiconductor (PMOS) transistors.

Referring to FIG. 3, which illustrates a schematic diagram of the process of the sense amplifier reading the data 0. When the voltage on the bit line BL is VBLP-$\Delta V$, and the voltage on the complementary bit line /BL is VBLP, the first transistor (1) and the second transistor (2) are turned on. Since the degree of turning on the first transistor (1) is greater than the degree of turning on the second transistor (2), the potential on the bit line BL is quickly pulled down to a voltage VSS at a node NCS. In the process of pulling down the voltage on the bit line BL, the second transistor (2) is turned off, the fourth transistor (4) is turned on, and a voltage VARY at a node PCS is applied to the complementary bit line /BL, such that the potential on the complementary bit line /BL is pulled up to the VARY. At this time, the normal operation of data read RD can be performed. After the data read is completed, the word line can be turned off (i.e., WL OFF), the sense amplifier is also turned off (i.e., SA OFF) at this time, and the bit line equilibrium control signal (i.e., BLEQ ON) is turned on, thereby completing the read process of the memory cell 100.

It should be noted that, before a next activation signal ACT arrives, there will be a precharge (PRE) process, namely the so-called RAS row precharge time tRP. The size of the row precharge time tRP determines the potential level of the bit line BL and the complementary bit line /BL. As shown in FIG. 3, if the row precharge time tRP is less, there is a possibility that the bit line BL and the complementary bit line /BL do not return to the same potential.

Figure 4:
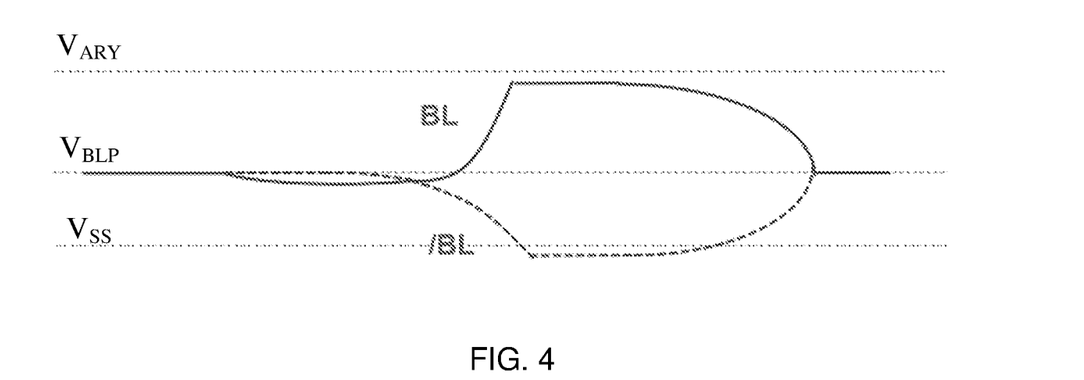
FIG. 4 schematically illustrates a schematic diagram of a potential change when a sense amplifier abnormally reading data 0 according to an exemplary embodiment of the present disclosure.

The process of sense amplifier sensing (SA sensing) shown in FIG. 3 belongs to the process of the sense amplifier normally sensing signal 0. Referring to FIG. 4, which illustrates a schematic diagram of a potential change when the sense amplifier abnormally sensing signal 0. In FIG. 4, when the sense amplifier senses the signal 0, the potential of the bit line BL is pulled up to the voltage VARY, resulting in the read signal being 1 instead of the really stored signal 0, which causes a read error. That is to say, according to whether the read data is correct or not, it can be determined whether the sense amplifier fails to sense 0.

By comparing FIG. 3 and FIG. 4, it can be seen that when the sense amplifier normally senses the signal 0, the potential on the bit line BL is always lower than the potential on the complementary bit line /BL. However, when the sense amplifier abnormally senses the signal 0, a situation where the potential on the bit line BL is higher than the potential on the complementary bit line /BL occurs. On this basis, the exemplary embodiments of the present disclosure provide a control to change the size of the row precharge time tRP (i.e., card tRP) to generate a situation where the potential on the bit line BL is higher than the potential on the complementary bit line /BL, such that the sense boundary of the sense amplifier can be determined, and the sense capability of the sense amplifier can be compared and analyzed.

In the process of controlling to change the size of the row precharge time tRP, as the row precharge time tRP becomes less and less, the potential on the bit line BL will gradually be higher than the potential on the complementary bit line/BL. When the potential on the bit line BL is higher than the potential on the complementary bit line /BL and reaches one critical value, the above situation where 0 is sensed unsuccessfully will occur. At this time, the corresponding row precharge time tRP can be used as the sense boundary of the sense amplifier for measuring the sense capability of the sense amplifier.

Figure 5:
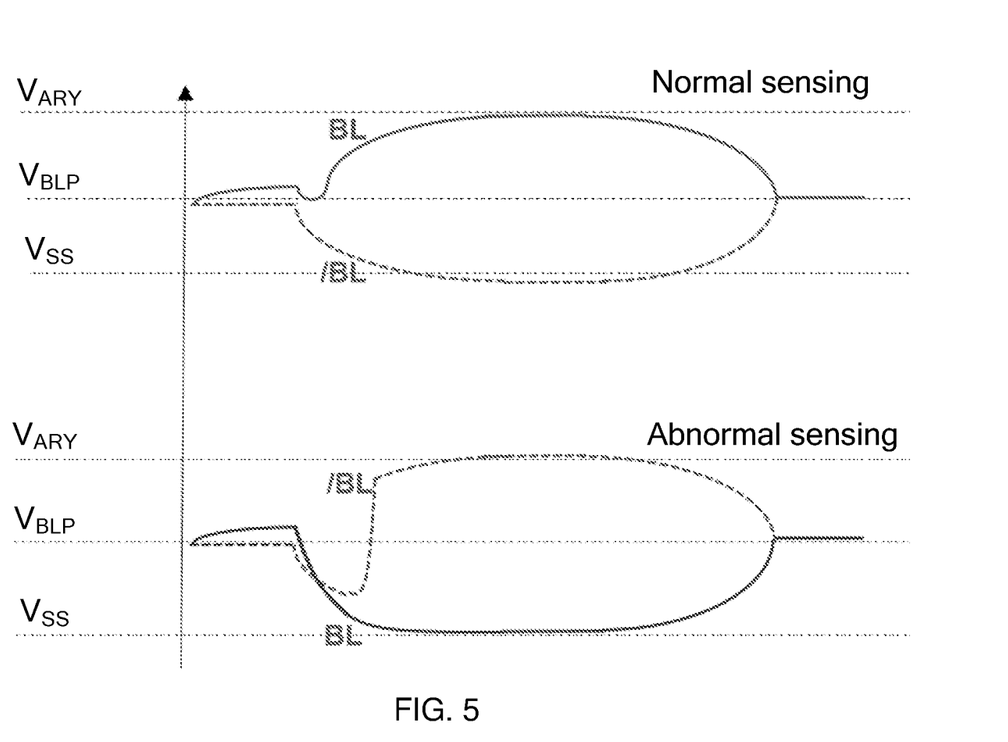
FIG. 5 schematically illustrates a schematic diagram of potential change comparison when read data is 1 in a sense amplifier according to an exemplary embodiment of the present disclosure.

Corresponding to the situation where 0 is sensed unsuccessfully, there is still a situation where 1 is sensed unsuccessfully. Referring to FIG. 5, when the sense amplifier normally senses the signal 1, the potential on the bit line BL is always higher than the potential on the complementary bit line /BL. However, when the sense amplifier abnormally senses the signal 1, a situation where the potential on the bit line BL is lower than the potential on the complementary bit line /BL occurs. Similarly, a control is provided to change the size of the row precharge time tRP to generate a situation where the potential on the bit line BL is lower than the potential on the complementary bit line /BL, such that the sense boundary of the sense amplifier can be determined, and the sense capability of the sense amplifier can be compared and analyzed.

Figure 6:
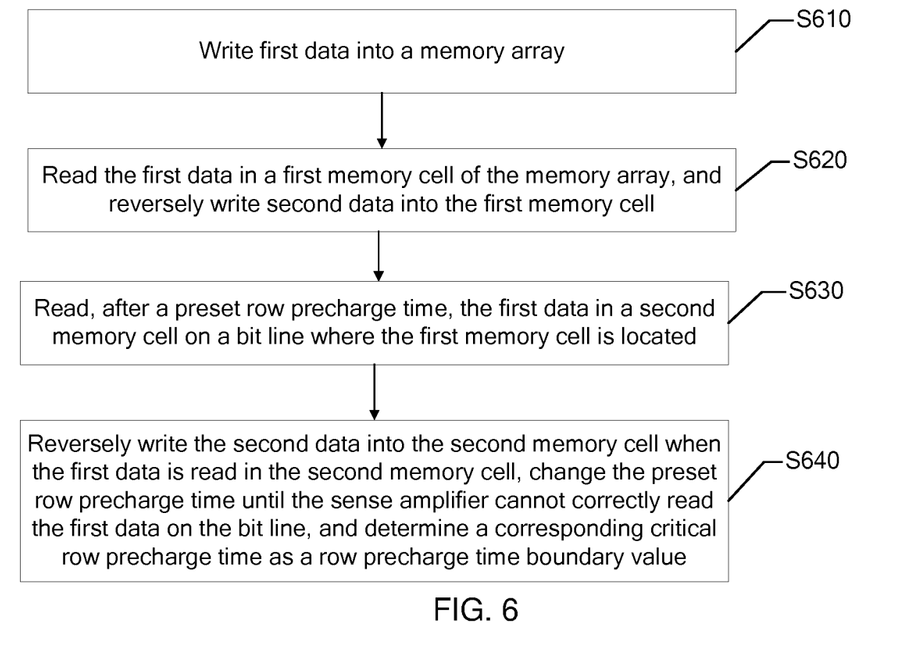
FIG. 6 schematically illustrates a flow diagram of a method for determining a sense boundary of a sense amplifier according to an exemplary embodiment of the present disclosure.

Referring to FIG. 6, the method for determining a sense boundary of a sense amplifier provided by the exemplary embodiments of the present disclosure may include:

Step S610, write first data into a memory array;

Step S620, read the first data in a first memory cell of the memory array, and reversely write second data into the first memory cell;

Step S630, read, after a preset row precharge time, the first data in a second memory cell on a bit line where the first memory cell is located; and Step S640, reversely write the second data into the second memory cell when the first data is read in the second memory cell, change the preset row precharge time until the sense amplifier cannot correctly read the first data on the bit line, and determine a corresponding critical row precharge time as a row precharge time boundary value.

In the method for determining a sense boundary of a sense amplifier provided by the exemplary implementation of the present disclosure, the first data is written into the memory array, and a potential on a bit line BL and a potential on a complementary bit line /BL can be changed by reversely writing the second data in the first memory cell after the first data in the first memory cell of the memory array is read. The first data in the second memory cell on the bit line where the first memory cell is located is read after the preset row precharge time tRP, and if the first data is read in the second memory cell, the second data is reversely written into the second memory cell, and the row precharge time tRP is changed until the sense amplifier cannot correctly read the first data on the bit line. This indicates that, at this time, a difference between the potential on the bit line BL and the potential on the complementary bit line /BL reaches one critical value, and a failed situation that the first data in the next memory cell cannot be sensed or read will occur. Thus, the corresponding critical row precharge time can be determined as the row precharge time boundary value for determine and measure the sense boundary of the sense amplifier, and accordingly for measuring the sense capability of the sense amplifier.

In step S610, the first data is written into the memory array.

In the exemplary implementation of the present disclosure, writing the first data into the memory array may be writing the first data into each memory cell of the memory array or writing the first data into each memory cell of the memory array on the bit line where the sense amplifier is located, such that only the sense boundary of the sense amplifier is determined.

It should be noted that the first data written into each memory cell may be data 0 or data 1.

In practical applications, there are many ways to write the first data into the memory array. For example, the way to write the first data into each memory cell of the memory array may be a way to write one by one, or may be a way to write according to X-Fast-Write.

In the exemplary implementation of the present disclosure, if the first data is only written into each memory cell of the memory array on the bit line where the sense amplifier is located, it may include: turning on one word line on the bit line, and sequentially writing the first data into each memory cell on the word line; and turning off the word line, turning on a next word line, and sequentially writing the first data into each memory cell on the next word line until all word lines on the same bit line are turned on and the first data is written into each memory cell thereon. That is to say, the first data can be written into all the word lines on the same bit line BL one by one.

Figure 7:
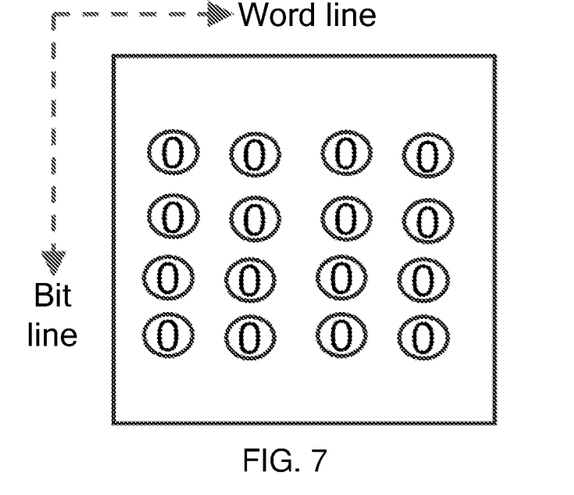
FIG. 7 schematically illustrates a schematic diagram of after writing first data into a memory array according to an exemplary embodiment of the present disclosure.

It is also possible to write the first data into all the word lines on the next bit line (for example, YC+1) in the memory array in the above manner until the first data is written into all the word lines in the memory array. When the situation where the written first data is 0 as shown in FIG. 7 is obtained, the first data can also be written into each memory cell of the memory array.

It should be noted that, if only the first data is written into all the word lines on the bit line BL where the sense amplifier is located, the first data can be written only into one bit line BL to be detected in the memory array, such that only the sense boundary of the sense amplifier on the bit line BL is determined. The first data can also be written into the word lines on any number of bit lines BL in the memory array, and the number of bit lines BL to which the first data is written is not particularly limited in the exemplary embodiments of the present disclosure.

In Step S620, the first data in the first memory cell of the memory array is read, and the second data is reversely written into the first memory cell.

In the exemplary embodiments of the present disclosure, the process of reading the first data may be started from the first memory cell. The first memory cell may be, for example, a first memory cell on one bit line BL, or a memory cell preset by the system or an artificially designated memory cell. The first memory cell may also comprise a plurality of memory cells on the first word line or the second word line. The exemplary embodiments of the present disclosure do not specifically limit the specific location of the first memory cell.

In the case that the first memory cell comprises a single memory cell, the process of reading the first data in the first memory cell may be direct reading. In the case that the first memory cell comprises a plurality of memory cells on a word line, reading the first data in the first memory cell is equivalent to reading the first data in the plurality of memory cells on the word line at the same time.

Figure 8:
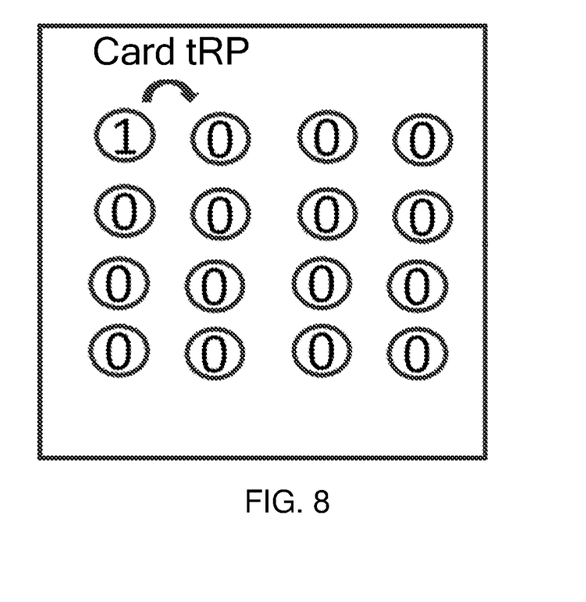
FIG. 8 schematically illustrates a schematic diagram of after reversely writing second data into a memory array in FIG. 7.

After the first data in the first memory cell is read, the second data needs to be reversely written into the first memory cell, as shown in FIG. 8, 1 is reversely written.

In the process of reading the first data according to the arrangement order of the memory cells, when the memory cell is the last memory cell on a word line, the next memory cell of the memory cell is the first memory cell on the next word line.

In step S630, after the preset row precharge time, the first data in the second memory cell on the bit line where the first memory cell is located is read.

Figure 9:
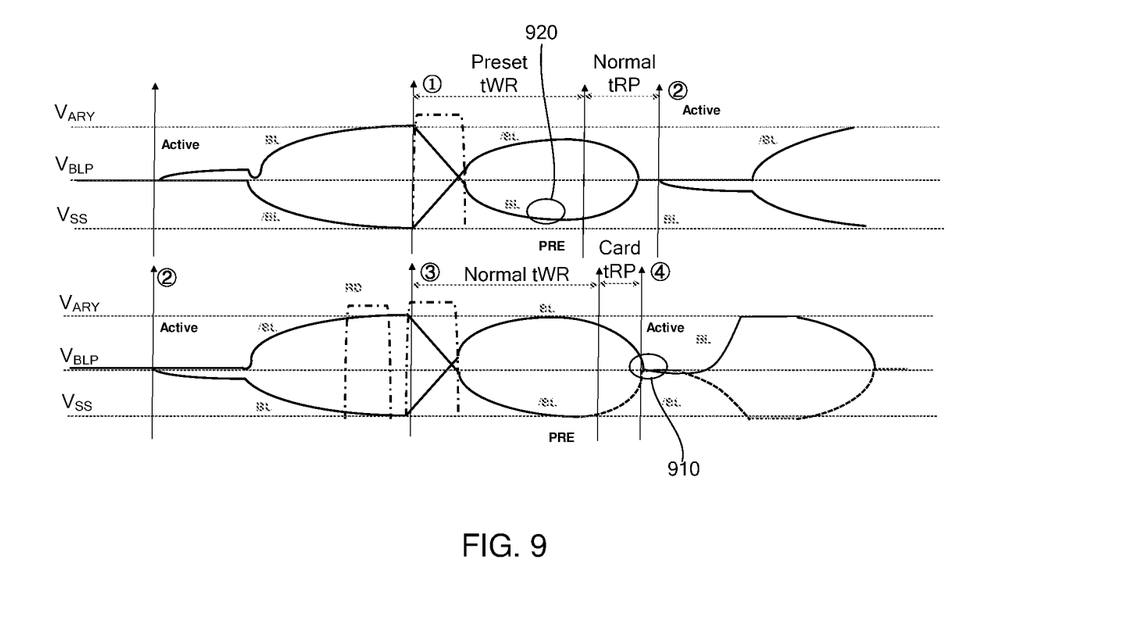
FIG. 9 schematically illustrates a situation of potential change of a sense amplifier in the process of reading data 0 according to an exemplary embodiment of the present disclosure.

Referring to FIG. 9, which illustrates a situation of potential change of the sense amplifier in the process of reading data 0 and reversely writing data 1. In the exemplary embodiments of the present disclosure, the time it takes to write the first data 0 into the memory array may be a preset write recovery delay tWR. After the preset write recovery delay tWR, the second data 1 can be reversely written again after the normal row precharge time Normal tRP, where the duration of reverse writing the second data 1 is a normal write recovery delay Normal tWR. In FIG. 9, (1)-(4) form a continuous process, where (1) and (2) form the process of writing and reading the first data, and (3) and (4) form the process of reversely writing the second data and reading the first data in the second memory cell on the bit line where the first memory cell is located. After the second data is reversely written, the row precharge time tRP needs to be performed strictly; and after the preset row precharge time tRP, the first data in the adjacent second memory cells on the bit line where the first memory cell is located is read, that is, the data 0 in the first row and the second row in FIG. 8 is read.

After the normal row precharge time Normal tRP, since the read data is 0, the potential on the bit line BL at this time is close to Vss, i.e., close to 0. In the process of data reverse writing, the potential on the bit line BL will rise. Since the duration of reversely writing the second data 1 is a normal write recovery delay Normal tWR, the potential on the bit line BL is close to VARY, i.e., close to 1. When the first data in the second memory cell on the bit line where the first memory cell is located is read, the first data in the second memory cell can be read after the preset row precharge time tRP. The preset row precharge time tRP can be adjusted according to actual situations. That is, the accuracy of the sense amplifier sensing the first data can be changed through the card tRP, such that the sense boundary of the sense amplifier is determined.

Figure 10:
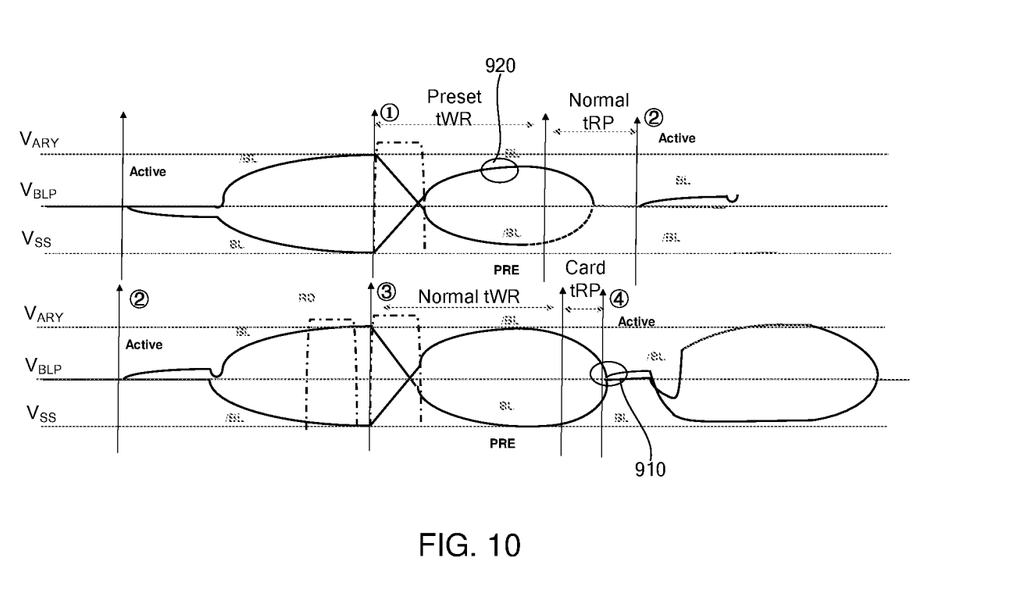
FIG. 10 schematically illustrates a situation of potential change of a sense amplifier in the process of reading data 1 according to an exemplary embodiment of the present disclosure.

Referring to FIG. 10, which illustrates a situation of potential change of the sense amplifier in the process of reading data 1 and reversely writing data 0. In the exemplary embodiments of the present disclosure, the time it takes to write the first data 1 into the memory array may be a preset write recovery delay tWR. After the preset write recovery delay tWR, the second data 0 can be reversely written again after the normal row precharge time Normal tRP, where the duration of reverse writing the second data 0 is a normal write recovery delay Normal tWR. In FIG. 10, (1) to (4) form a continuous process, where (1) and (2) form the process of writing and reading the first data, and (3) and (4) form the process of reversely writing the second data and reading the first data in the second memory cell on the bit line where the first memory cell is located. After the second data is reversely written, the row precharge time tRP needs to be performed strictly; and after the preset row precharge time tRP, the first data in the adjacent second memory cells on the bit line where the first memory cell is located is read, that is, the data 0 is read.

After the normal row precharge time Normal tRP, since the read data is 1, the potential on the bit line BL at this time is close to VARY, i.e., close to 1. In the process of data reverse writing, the potential on the bit line BL will drop. Since the duration of reversely writing the second data 0 is a normal write recovery delay Normal tWR, the potential on the bit line BL is close to VSS, i.e., close to 0. When the first data in the second memory cell on the bit line where the first memory cell is located is read, the first data in the second memory cell can be read after the preset row precharge time tRP. The preset row precharge time tRP can be adjusted according to actual situations. That is, the accuracy of the sense amplifier sensing the first data can be changed through the card tRP, such that the sense boundary of the sense amplifier, namely the critical row precharge time is determined.

In the process of actually determining the critical row precharge time, the size thereof is affected by the write recovery delay. Therefore, in the exemplary embodiments of the present disclosure, when the first data in each memory cell is sequentially read and the second data is reversely written, the write recovery delay Normal tWR of reversely writing the second data in each memory cell is the same. That is to say, the write recovery delay Normal tWR of reversely writing the second data in the first memory cell is the same as the write recovery delay Normal tWR of reversely writing the second data in the second memory cell. Under the same write recovery delay Normal tWR, the determined critical row precharge time is more accurate. Sequentially reading the first data in each memory cell may be reading according to the arrangement order of the memory cells, or may be reading according to the arrangement order of the word lines, which is not particularly limited herein. It should be noted that the write recovery delay herein may be the normal row precharge time Normal tRP or the preset write recovery delay tWR.

After the preset row precharge time tRP, two situations will occur in the process of reading the first data in the second memory cell, that is, the read data is first data, and the read data is second data.

In step S640, when the first data is read in the second memory cell, the second data is reversely written into the second memory cell, and the preset row precharge time is changed until the sense amplifier cannot correctly read the first data on the bit line, that is, the sensing is wrong, and at this time, the corresponding critical row precharge time is determined as the row precharge time boundary value.

When the read data is the first data, it indicates that reading is correct, the second data is reversely written into the second memory cell continuously, and the preset row precharge time tRP is changed. The first data in the next memory cell of the second memory cell is read until the sense amplifier cannot correctly read the first data on the bit line BL where the sense amplifier is located, and then the corresponding critical row precharge time is determined as the row precharge time boundary value.

When the read data is the second data, that is, no first data is read in the second memory cell, it indicates that reading is wrong and belongs to abnormal data reading. The corresponding critical row precharge time can be determined as the row precharge time boundary value at this time, or the second data can be reversely written continuously, and the preset row precharge time tRP, namely card tRP is changed until the first data is correctly read, and then the corresponding previous preset row precharge time tRP is determined as the row precharge time boundary value. Specifically, the size of card tRP can be determined according to the actual situations. This is not particularly limited in the exemplary embodiments of the present disclosure.

Figure 11:
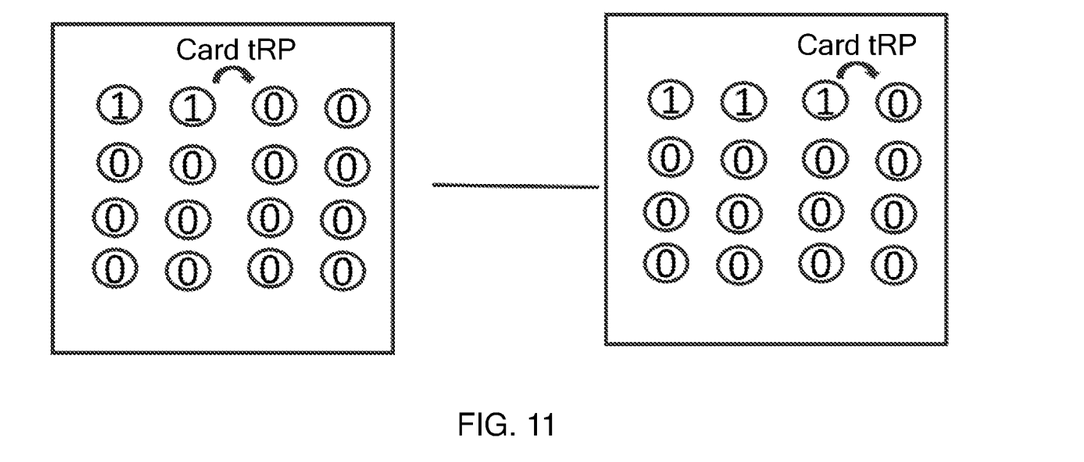
FIG. 11 schematically illustrates a schematic diagram of after performing read and reverse write in a memory array in FIG. 8.

After the first data is read and the second data is reversely written for the first memory cell and the second memory cell in FIG. 7 and FIG. 8, the same operations can also be performed again for the next memory cells with reference to FIG. 11, until the row precharge time boundary value of the sense amplifier on the bit line is determined.

Figure 12:
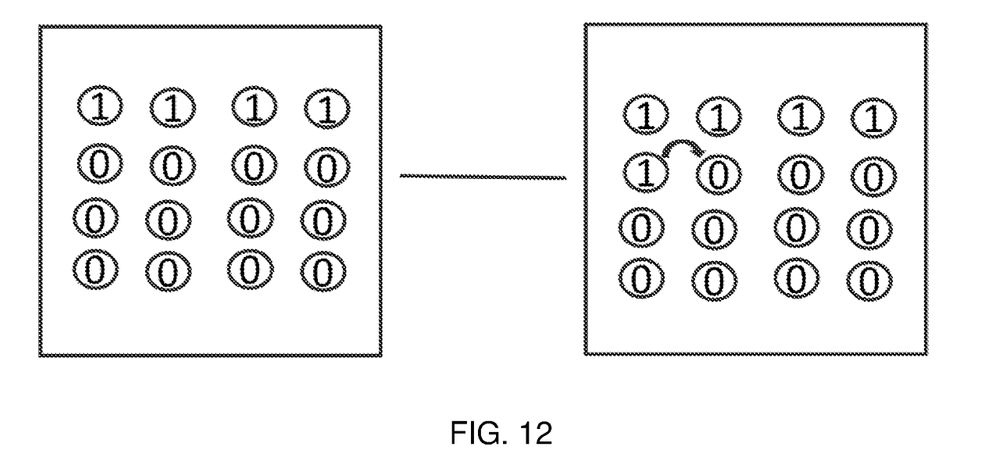
FIG. 12 schematically illustrates a schematic diagram of after performing read and reverse write in a sense amplifier on a next bit line of a memory array in FIG. 11.

After the row precharge time boundary value of the sense amplifier on the first bit line is determined, the row precharge time boundary value of the sense amplifier on the next bit line can be determined with reference to FIG. 12. The specific determination method is the same, and is not described again herein.

Figure 13:
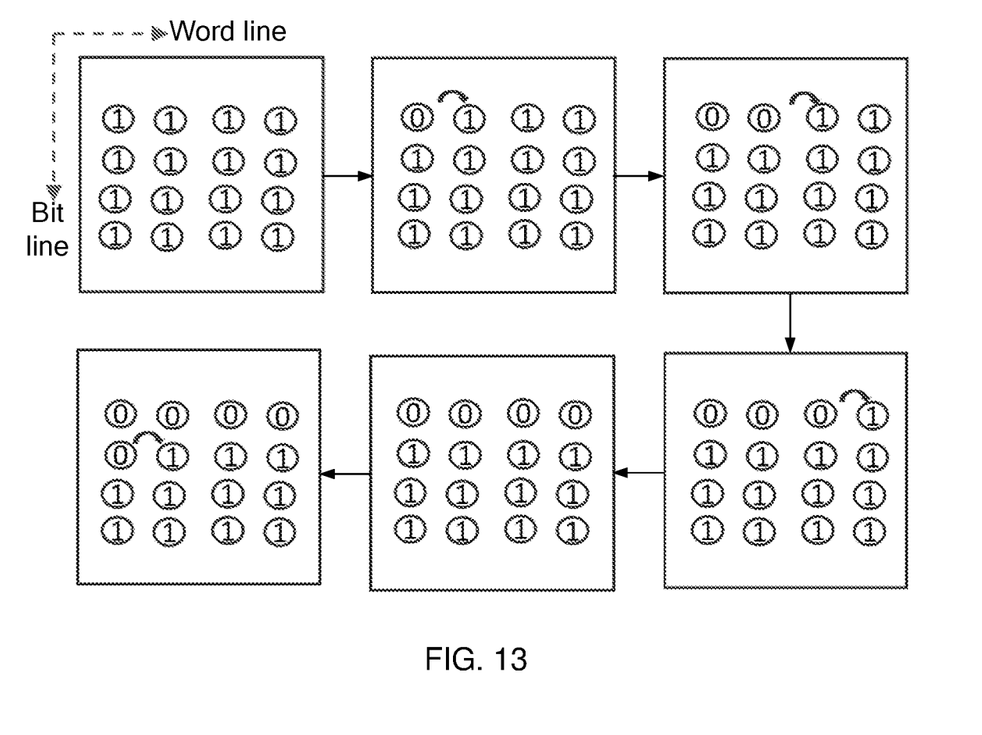
FIG. 13 schematically illustrates another schematic diagram of after performing read and reverse write in a memory array according to an exemplary embodiment of the present disclosure.

According to the above method, referring to FIG. 13, when the first data is 1 and the second data is 0, for the first bit line, the process of reading the first data read and reversely writing the second data can be performed starting from the first memory cell, the first data in the second memory cell is read through the card tRP, and the second data is reversely written for the second memory cell, until the row precharge time boundary value of the sense amplifier corresponding to the first bit line is determined according to the above mode. The same process of reading the first data read and reversely writing the second data can be performed for the memory cell on the second bit line, and the data in the next memory cell is read through the card tRP, so as to determine the row precharge time boundary value of the sense amplifier corresponding to the second bit line.

In practical applications, the sense capability of the sense amplifier can be measured according to the row precharge time boundary value. Under the same write recovery delay tWR, if the row precharge time boundary value is less, it indicates that the sense capability of the sense amplifier is stronger. By taking sensing data 0 as an example, if the row precharge time boundary value is less, it indicates that the difference between the potential on the bit line BL and the potential on the complementary bit line /BL in a sense region 910 in FIG. 9 is greater, which means that the sense amplifier is more fault-tolerant and more reliable.

In practical applications, different sense amplifiers have different determined row precharge time boundary values. In the exemplary implementation of the present disclosure, for conventional sense amplifiers, the determined row precharge time boundary value is any value between 5 and 20 ns.

It should be noted that, since one sense amplifier corresponds to one bit line, in the process of determining the sense boundary of the sense amplifier, the used memory cells, such as the above first memory cell and second memory cell, need to be the memory cells on the same bit line. Or, when the first memory cell comprises a plurality of memory cells on the first word line, and the second memory cell comprises a plurality of memory cells on the second word line, the first word line and the second word line need to be on the same bit line, i.e., sharing the same bit line.

To facilitate the reading of data, and the reverse writing of data in the first storage unit to affect the second memory cell, the second memory cell is the next memory cell on the bit line where the first memory cell is located. Generally, after the first memory cell is written, the second memory cell is written. Or, after the data in the first memory cell is read, the data in the second memory cell is read. Or, the second word line is the next word line of the first word line, and after the first word line is read and written, the second word line is read and written.

In the exemplary implementation of the present disclosure, to make the sensing wrong, it can also be realized by changing the preset write recovery delay tWR for writing the first data on the basis of the above card tRP, that is, the preset tWR of the first data is written into a card. By presetting the tWR of the card, for example, reducing the preset tWR, the written data can be insufficient, which is beneficial to the situation that the sensing is wrong in the card tRP.

In practical applications, when the first data to be written is 0, after the preset write recovery delay, the corresponding written first data is any value between 0 and 0.5, namely the region 920; and when the first data to be written is 1, after the preset write recovery delay, the corresponding written first data is any value between 0.5 and 1, namely the region 920.

In practical applications, to make the voltage of writing the second data insufficient, that is, to further create worse condition, the difference between the potential on the bit line BL and the potential on the complementary bit line /BL is greater, and it is possible to reduce the voltage applied to the word line of the first memory cell in the process of reverse writing the second data into the first memory cell. The lower the voltage on the word line, the less the word line is turned on, such that the write-back voltage can be reduced.

It should be noted that, to improve the comparability of the determined row precharge time boundary value, the voltage applied to the word line in each memory cell is consistent, that is, the voltage applied to the word line of the first memory cell is the same as the voltage applied to the word line of the second memory cell.

In conclusion, in the exemplary implementation of the present disclosure, after the first data is written into the memory array, the first data in the memory cell is read, and the second data is reversely written, the difference between the potential on the bit line BL and the potential on the complementary bit line /BL can be changed in combination with the card tRP. When the voltage difference reaches one critical value, the situation where the first data is wrongly read occurs. In such a situation, the determined critical row precharge time is the row precharge time boundary value for measuring the sense capability of the sense amplifier.

It should be noted that although the steps of the method in the present disclosure are described in the accompanying drawings in a particular sequence, it is not required or implied that the steps must be performed in that particular sequence or that all of the steps shown must be performed to achieve the desired results. Additionally or alternatively, some steps may be omitted, a plurality of steps may be combined into a single step for execution, and/or a single step may be divided into a plurality of steps for execution.

Figure 14:
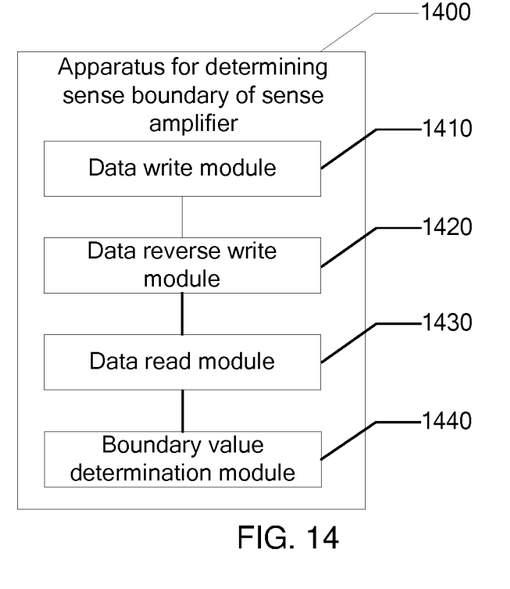
FIG. 14 schematically illustrates a block diagram of an apparatus for determining a sense boundary of a sense amplifier according to an exemplary embodiment of the present disclosure.

In this exemplary implementation, an apparatus for determining a sense boundary of a sense amplifier is also provided. Referring to FIG. 14, the apparatus 1400 for determining a sense boundary of a sense amplifier may include a data write module 1410, a data reverse write module 1420, a data read module 1430, and a boundary value determination module 1440.

The data write module 1410 may be configured to write first data into a memory array.

The data reverse write module 1420 may be configured to read the first data in a first memory cell of the memory array, and reversely write second data into the first memory cell.

The data read module 1430 may be configured to read, after a preset row precharge time, the first data in a second memory cell on a bit line where the first memory cell is located.

The boundary value determination module 1440 may be configured to reversely write the second data into the second memory cell when the first data is read in the second memory cell, change the preset row precharge time until the sense amplifier cannot correctly read the first data on the bit line, and determine a corresponding critical row precharge time as a row precharge time boundary value.

In one exemplary implementation of the present disclosure, the boundary value determination module 1440 may also be configured to: reversely write the second data into the second memory cell when the first data is not read in the second memory cell, change the preset row precharge time tRP until the sense amplifier correctly reads the first data on the bit line, and determine a corresponding previous preset row precharge time as the row precharge time boundary value.

In one exemplary implementation of the present disclosure, the second memory cell is a next memory cell on the bit line where the first memory cell is located.

In one exemplary implementation of the present disclosure, the first memory cell comprises a plurality of memory cells on a first word line, the second memory cell comprises a plurality of memory cells on a second word line, and the first word line and the second word line share the same bit line.

In one exemplary implementation of the present disclosure, the second word line is a next word line of the first word line.

In one exemplary implementation of the present disclosure, the time it takes to write the first data into the memory array is a preset write recovery delay.

In one exemplary implementation of the present disclosure, in the case where the first data is 0, after the preset write recovery delay, the corresponding written first data is any value between 0 and 0.5.

In one exemplary implementation of the present disclosure, in the case where the first data is 1, after the preset write recovery delay, the corresponding written first data is any value between 0.5 and 1.

In one exemplary implementation of the present disclosure, the determined row precharge time boundary value is any value between 5 and 20 ns.

In one exemplary implementation of the present disclosure, the time it takes to reversely write the second data into the first memory cell is the same as the time it takes to reversely write the second data into the second memory cell.

In one exemplary implementation of the present disclosure, the data write module 1410 may be configured to write the first data into each memory cell of the memory array.

In one exemplary implementation of the present disclosure, the data write module 1410 may be configured to write the first data into each memory cell of the memory array on the bit line where the sense amplifier is located.

In one exemplary implementation of the present disclosure, the data reverse write module 1420 may be configured to reduce a voltage applied to the word line of the first memory cell in the process of reversely writing the second data into the first memory cell, such that a voltage of writing the second data is insufficient.

In one exemplary implementation of the present disclosure, the data reverse write module 1420 may be configured to reduce a voltage applied to the word line of the first memory cell in the process of reversely writing the second data into the first memory cell, such that a voltage of the written second data is insufficient.

In one exemplary implementation of the present disclosure, the voltage applied to the word line of the first memory cell is equal to a voltage applied to the word line of the second memory cell.

The specific details of a virtual module of each apparatus for determining a sense boundary of a sense amplifier are described in detail in the corresponding method for determining a sense boundary of a sense amplifier. Therefore, details are not described again herein.

Although several modules or units of the apparatus for determining a sense boundary of a sense amplifier are mentioned in the above detailed description, such division of modules or units is not mandatory. According to the implementations of the present disclosure, the features and functions of two or more modules or units described above may be embodied in one module or unit. Correspondingly, the features and functions of a module or unit described above may be further divided into a plurality of modules or units to be embodied.

An exemplary embodiment of the present disclosure further provides an electronic device that can be configured to implement the foregoing method.

Those skilled in the art can understand that aspects of the present disclosure may be implemented as systems, methods, or program products. Therefore, the aspects of the present disclosure may be specifically implemented in a form of a fully hardware implementation, a fully software implementation (including firmware, microcode, or the like), or a combination of hardware and software, which may be collectively referred to as a "circuit", "module", or "system".

An electronic device 1500 according to the implementation of the present disclosure is described below with reference to FIG. 15. The electronic device 1500 shown in FIG. 15 is only an example, which should not be construed as any limitation on the function and application scope of the embodiment of the present disclosure.

Figure 15:
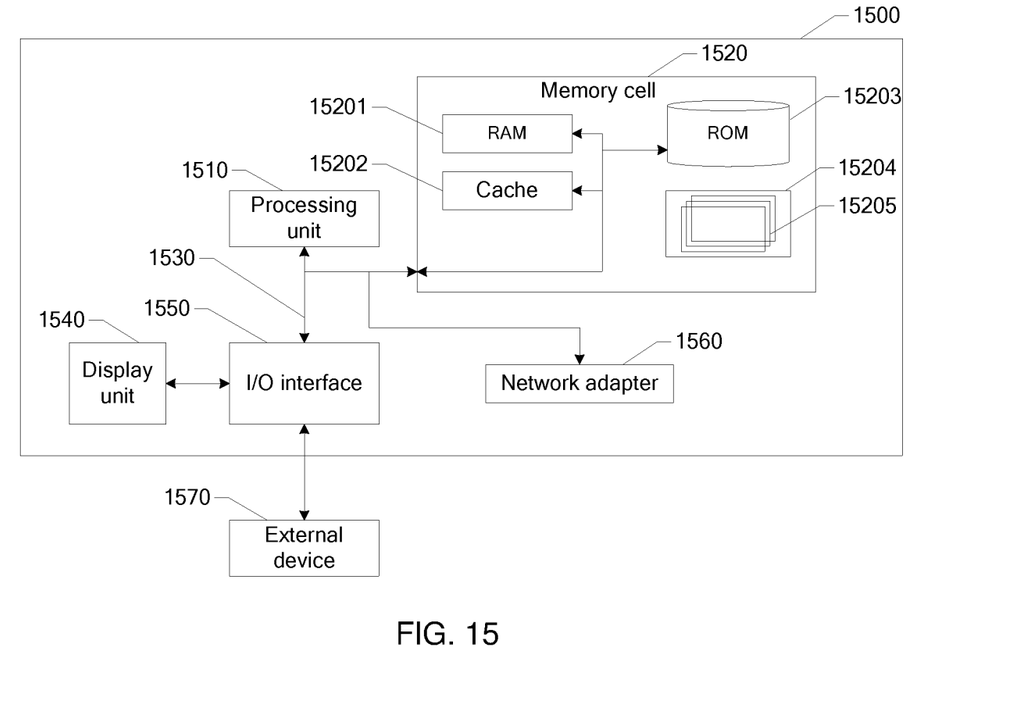
FIG. 15 schematically illustrates a schematic module diagram of an electronic device according to an exemplary embodiment of the present disclosure.

As shown in FIG. 15, the electronic device 1500 is represented in the form of a general purpose computer.

Components of the electronic device 1500 may include, but are not limited to, at least one processing unit 1510, at least one memory cell 1520, a bus 1530 connecting different system components (including the memory cell 1520 and the processing unit 1510), and a display unit 1540.

The memory cell 1520 stores program code which can be executed by the processing unit 1510, such that the processing unit 1510 performs the steps according to the exemplary implementations of the present disclosure described in the "exemplary methods" of the specification. For example, as shown in FIG. 6, the processing unit 1510 may perform step S610: write first data into a memory array; step S620: read the first data in a first memory cell of the memory array, and reversely write second data into the first memory cell; step S630: read, after a preset row precharge time, the first data in a second memory cell on a bit line where the first memory cell is located; and step S640: reversely write the second data into the second memory cell when the first data is read in the second memory cell, change the preset row precharge time until the sense amplifier cannot correctly read the first data on the bit line, and determine a corresponding critical row precharge time as a row precharge time boundary value.

The memory cell 1520 may include a readable medium in a form of a volatile memory cell, for example, a RAM 15201 and/or a cache memory cell 15202, and may further include a ROM 15203.

The memory cell 1520 may alternatively include a program/utility 15204 including a set of (at least one) program modules 15205, and the program modules 15205 each include, but are not limited to: an operating system, one or more applications, other program modules and program data. Each of these examples or some combination thereof may include an implementation of a network environment.

The bus 1530 may be one or more of several types of bus structures, including a memory cell bus or a memory cell controller, a peripheral bus, a graphics acceleration port, a processing unit, or a local area bus using any one of a plurality of bus structures.

The electronic device 1500 may further communicate with one or more external devices 1570 (for example, a keyboard, a pointing device, or a Bluetooth device), with one or more devices that enable a user to interact with the electronic device 1500, and/or with any device that enables the electronic device 1500 to communicate with one or more other computing devices (for example, a router or a modem). Such communication may be performed through an input/output (1/O) interface 1550. The electronic device 1500 may further communicate with one or more networks (for example, a LAN, a WAN, and/or a public network such as the Internet) through a network adapter 1560. As shown in the figure, the network adapter 1560 communicates with other modules of the electronic device 1500 through the bus 1530. Although not shown in the figure, other hardware and/or software modules may be used in combination with the electronic device 1500, including but not limited to: microcode, a device driver, a redundant processing unit, an external disk drive array, an RAID system, a tape driver, and a data backup storage system.

Figure 16:
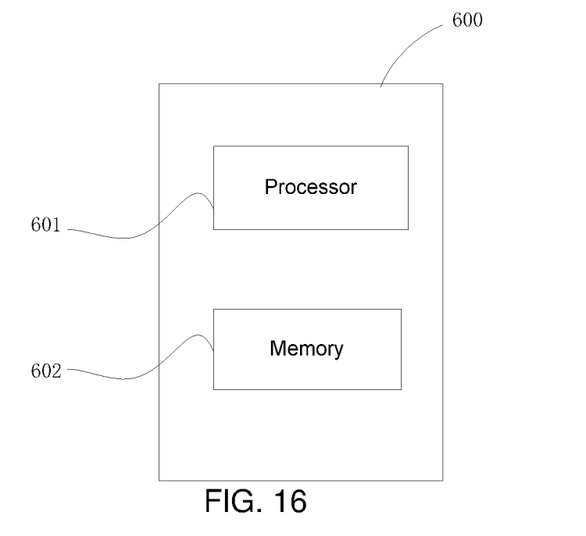
FIG. 16 is a block diagram of an apparatus for determining a sense boundary of a sense amplifier according to an exemplary embodiment.

An exemplary embodiment of the present disclosure provides an apparatus for determining a sense boundary of a sense amplifier. Referring to FIG. 16, the apparatus for determining a sense boundary of a sense amplifier 600 may be provided as a terminal device. The apparatus for determining a sense boundary of a sense amplifier 600 may include a processor 601, and one or more processors may be set as required. The apparatus for determining a sense boundary of a sense amplifier 600 may further include a memory 602 configured to store an executable instruction, such as an application program, of the processor 601. One or more memories may be set as required. The memory may store one or more application programs. The processor 601 is configured to execute the instruction to perform the foregoing method.

Through the foregoing description of the implementations, persons skilled in the art may easily understand that the exemplary implementations described herein may be implemented by software, or may be implemented by software in combination with necessary hardware. Therefore, the technical solutions according to the implementations of the present disclosure may be implemented in a form of a software product. The software product may be stored in a non-volatile storage medium (which may be a compact disk read-only memory (CD-ROM), a USB flash drive, a removable hard disk, or the like), and includes a plurality of instructions to cause a computing device (which may be a personal computer, a server, a terminal apparatus, a network device, or the like) to perform the method according to the implementation of the present disclosure.

An exemplary embodiment of the present disclosure further provides a computer-readable storage medium. Referring to FIG. 16, for example, the computer-readable storage medium may be the memory 602 including instructions. The foregoing instructions may be executed by the processor 601 of the apparatus for determining a sense boundary of a sense amplifier 600 to complete the foregoing method. In some possible implementations, various aspects of the present disclosure may alternatively be implemented in a form of a program product, which includes program code. When the program product runs on a terminal device, the program code is used to enable the terminal device to perform the steps according to various exemplary implementations of the present disclosure described in the foregoing "exemplary methods" of this specification.

A program product for implementing the method according to the embodiments of the present disclosure may be in the form of a portable compact disk read-only memory (CD-ROM) and include program code, and may be run on a terminal device, such as a personal computer. However, the program product of the present disclosure is not limited hereto. In the present disclosure, a readable storage medium may be any tangible medium that contains or stores a program, and the program may be used by or in combination with an instruction execution system, apparatus, or device.

The program product may be any combination of one or more readable media. The readable media each may be a readable signal medium or a readable storage medium. The readable storage medium, may be, for example, but not limited to, electrical, magnetic, optical, electromagnetic, infrared, or semiconductor systems, apparatuses, or devices, or any combination thereof. More specific examples (non-exhaustive) of the readable storage medium include an electrical connection with one or more conducting wires, a portable computer disk, a hard disk, a random access memory (RAM), a read-only memory (ROM), an erasable programmable ROM (an EPROM or a flash memory), an optical fiber, a portable CD-ROM, an optical storage device, a magnetic storage device, or any suitable combination thereof.

The computer-readable signal medium may include a data signal propagated in a baseband or as a part of a carrier, and readable program code is carried therein. The propagated data signal may be in various forms, including but not limited to an electromagnetic signal, an optical signal, or any suitable combination thereof. The readable signal medium may alternatively be any readable medium other than the readable storage medium. The readable medium may send, propagate, or transmit a program to be used by or in combination with the instruction execution system, apparatus, or device.

The program code contained on the readable medium may be transmitted using any suitable medium, including but not limited to: a wireless medium, a wired medium, an optical fiber, an RF, or any suitable combination thereof.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

Program code for executing the operations in the present disclosure may be compiled by using any combination of one or more programming languages. The programming languages include object oriented programming languages, such as Java and C++, and conventional procedural programming languages, such as C or similar programming languages. The program code can be executed fully on a user computing device, executed partially on a user device, executed as an independent software package, executed partially on a user computing device and partially on a remote computing device, or executed fully on a remote computing device or a server. In a circumstance in which a remote computer is involved, the remote computer may be connected to a user computer via any type of network, including a LAN or a WAN, or may be connected to an external computer (for example, connected via the Internet by using an Internet service provider).

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

In the method for determining a sense boundary of a sense amplifier provided by the embodiment of the present disclosure, the first data is written into the memory array, and a potential on a bit line and a potential on a complementary bit line can be changed by reversely writing the second data in the first memory cell after the first data in the first memory cell of the memory array is read. The first data in the second memory cell on the bit line where the first memory cell is located is read after the preset row precharge time, and if the first data is read in the second memory cell, the second data is reversely written into the second memory cell, and the row precharge time is changed until the sense amplifier cannot correctly read the first data on the bit line. This indicates that, at this time, a difference between the potential on the bit line and the potential on the complementary bit line reaches one critical value, and a failed situation that the first data in the next memory cell cannot be sensed or read will occur. Thus, the corresponding critical row precharge time can be determined as the row precharge time boundary value for determine and measure the sense boundary of the sense amplifier, and accordingly for measuring the sense capability of the sense amplifier.

What is claimed is:

1. A method for determining a sense boundary of a sense amplifier, comprising:
    writing first data into a memory array;
    reading the first data in a first memory cell of the memory array, and reversely writing second data into the first memory cell, and reducing a voltage applied to a word line of the first memory cell in the process of reversely writing the second data into the first memory cell, such that a voltage of writing the second data is insufficient;
    reading, after a preset row precharge time, the first data in a second memory cell on a bit line where the first memory cell is located; and
    reversely writing the second data into the second memory cell in response to the first data is-being read in the second memory cell, changing the preset row precharge time until the sense amplifier cannot correctly read the first data on the bit line, and determining a corresponding critical row precharge time as a row precharge time boundary value.

2. The method according to claim 1, further comprising:
    reversely writing the second data into the second memory cell in response to the first data being not read in the second memory cell, changing the preset row precharge time until the sense amplifier correctly reads the first data on the bit line, and determining a corresponding previous preset row precharge time as the row precharge time boundary value.

3. The method according to claim 1, wherein the second memory cell is a next memory cell on the bit line where the first memory cell is located.

4. The method according to claim 1, wherein the first memory cell comprises a plurality of memory cells on a first word line, the second memory cell comprises a plurality of memory cells on a second word line, and the first word line and the second word line share the same bit line.

5. The method according to claim 4, wherein the second word line is a next word line of the first word line.

6. The method according to claim 1, wherein a time it takes to write the first data into the memory array is a preset write recovery delay.

7. The method according to claim 6, wherein in a case where the first data to be written is 0, after the preset write recovery delay, a corresponding written first data is any value of written data corresponding to a voltage range of 0.5 Vss to 1 Vss.

8. The method according to claim 6, wherein in a case where the first data to be written is 1, after the preset write recovery delay, a corresponding written first data is any value of written data corresponding to a voltage range of 0.5 Vary to 1 Vary.

9. The method according to claim 1, wherein the determined row precharge time boundary value is any value between 5 ns and 20 ns.

10. The method according to claim 1, wherein a time it takes to reversely write the second data into the first memory cell is the same as a time it takes to reversely write the second data into the second memory cell.

11. The method according to claim 1, wherein the writing first data into a memory array comprises:
    writing the first data into each memory cell of the memory array.

12. The method according to claim 1, wherein the writing first data into a memory array comprises:
    writing the first data into each memory cell of the memory array on the bit line where the sense amplifier is located.

13. The method according to claim 12, wherein the writing the first data into each memory cell of the memory array on the bit line where the sense amplifier is located comprises:
    turning on a word line on the bit line, and sequentially writing the first data into each memory cell on the word line; and
    turning off the word line, turning on a next word line, and sequentially writing the first data into each memory cell on the next word line until all word lines on the same bit line are turned on and the first data is written into each memory cell sequentially on all word lines on the same bit line.

14. The method according to claim 1, wherein the voltage applied to the word line of the first memory cell is equal to a voltage applied to a word line of the second memory cell.

15. A non-transitory computer-readable storage medium, on which a computer program is stored, wherein the computer program is executed by a processor to implement the method for determining a sense boundary of a sense amplifier according to claim 1.

16. An apparatus for determining a sense boundary of a sense amplifier, comprising:
    one or more processors; and
    a storage apparatus, configured to store one or more programs, wherein the one or more programs, when executed by the one or more processors, cause the one or more processors to execute operations of:
    writing first data into a memory array;
    reading the first data in a first memory cell of the memory array, and reversely writing second data into the first memory cell, and reducing a voltage applied to a word line of the first memory cell in the process of reversely writing the second data into the first memory cell, such that a voltage of writing the second data is insufficient;
    reading, after a preset row precharge time, the first data in a second memory cell on a bit line where the first memory cell is located; and
    reversely writing the second data into the second memory cell in response to the first data being read in the second memory cell, changing the preset row precharge time until the sense amplifier cannot correctly read the first data on the bit line, and determining a corresponding critical row precharge time as a row precharge time boundary value.

* * * * *